(12) United States Patent
Mai (10) Patent No.: US 9,984,857 B2
(45) Date of Patent: May 29, 2018

(54) PLASMA GENERATION DEVICE

(71) Applicant: Meyer Burger (Germany) AG, Hohenstein-Ernstthal (DE)

(72) Inventor: Joachim Mai, Nobitz (DE)

(73) Assignee: Meyer Burger (Germany) AG, Hohenstein-Ernstthal (DE)

( * ) Notice: Subject to any disclaimer, the term of this patent is extended or adjusted under 35 U.S.C. 154(b) by 28 days.

(21) Appl. No.: 14/917,967

(22) PCT Filed: Sep. 11, 2014

(86) PCT No.: PCT/EP2014/069411
§ 371 (c)(1),
(2) Date: Mar. 10, 2016

(87) PCT Pub. No.: WO2015/036494
PCT Pub. Date: Mar. 19, 2015

(65) Prior Publication Data
US 2016/0217978 A1      Jul. 28, 2016

(30) Foreign Application Priority Data

Sep. 12, 2013 (EP) .................................. 13184184

(51) Int. Cl.
*H01J 37/32*          (2006.01)

(52) U.S. Cl.
CPC ...... *H01J 37/32091* (2013.01); *H01J 37/321* (2013.01); *H01J 37/32669* (2013.01); *H01J 37/32697* (2013.01)

(58) Field of Classification Search
None
See application file for complete search history.

(56) References Cited

U.S. PATENT DOCUMENTS

| 6,518,195 B1 | 2/2003 | Collins et al. |
| 8,421,377 B2 * | 4/2013 | Kirchmeier ....... H01J 37/32045 315/291 |

(Continued)

FOREIGN PATENT DOCUMENTS

| DE | 10358505 B4 | 10/2007 |
| TW | 200939895 A | 9/2009 |

(Continued)

OTHER PUBLICATIONS

Meziani T et al.: "Design of a magnetic pole enhanced inductively coupled plasma source; Design of a magnetic-pole-enhanced ICP source", Plasma Sources Science and Technology, Institute of Physics Publishing, Bristol, GB, vol. 10, No. 2, May 1, 2001 (May 1, 2001), pp. 276-283, XP020069878, ISSN: 0963-0252, DOI: 10.1088/0963-0252/10/2/317.

*Primary Examiner* — Douglas W Owens
*Assistant Examiner* — Srinivas Sathiraju
(74) *Attorney, Agent, or Firm* — Michael Soderman (57) ABSTRACT

The subject matter of the instant invention is a plasma generation device in which at least one inductive device and at least one capacitive device are provided for coupling energy into a plasma in a plasma chamber. The at least one inductive device and the at least one capacitive device can be supplied with energy separately from one another by different frequency generators or by a common frequency generator.

13 Claims, 8 Drawing Sheets

(56) References Cited

U.S. PATENT DOCUMENTS

| | | | | |
|---|---|---|---|---|
| 8,643,279 B2* | 2/2014 | Kirchmeier | ....... | H01J 37/32045 315/111.21 |
| 9,431,217 B2* | 8/2016 | Mai | ..................... | H01J 37/3222 |
| 9,453,280 B2* | 9/2016 | Kato | ..................... | C23C 16/345 |
| 2010/0171427 A1* | 7/2010 | Kirchmeier | ....... | H01J 37/32045 315/111.21 |
| 2012/0145322 A1* | 6/2012 | Gushiken | .............. | H01J 37/321 156/345.28 |
| 2012/0160806 A1* | 6/2012 | Godyak | ................ | H01J 37/321 216/61 |
| 2013/0243966 A1* | 9/2013 | Schett | .................... | C23C 14/48 427/523 |

FOREIGN PATENT DOCUMENTS

| | | |
|---|---|---|
| TW | 201203359 A | 1/2012 |
| WO | 2010108847 A1 | 9/2010 |
| WO | 2011022612 A2 | 2/2011 |

* cited by examiner

PLASMA GENERATION DEVICE

CROSS REFERENCE TO RELATED APPLICATIONS

This application is the U.S. national stage of International Application No. PCT/EP2014/069411, filed on Sep. 11, 2014, and claims the priority thereof. The international application claims the priority of European Application No. EP 13184184.3 filed on Sep. 12, 2013; all applications are incorporated by reference herein in their entirety.

BACKGROUND

The invention relates to a plasma source that combines the advantages of inductively coupled plasma and capacitively coupled plasma.

Inductively coupled plasmas (ICP) reach a high ion density with low plasma potential. Furthermore, large area plasmas can also be created. In combination with plasma generation that is especially simple, this makes an economical method of operation of the plasma sources possible.

Capacitively coupled plasmas (CCP) have a lower ignition temperature because of the lower excitation and rotation temperatures. Due to the ease of handing and the stability, capacitively coupled plasma can be used for a multitude of applications, among them in aerosols or wet gasses, in which other plasmas would be extinguished under certain circumstances. CCP coupling is especially well suited to accelerate ions in the plasma and extract them for processing.

Both types of plasma generation consequently have their advantages and reasons for existing in the technology.

An ICP source is described in DE 103 58 505 B4 that has a magnetic pole shoe arrangement; the exciter coils are arranged in grooves of the pole shoes. The pole shoes bring about a concentration of the magnetic fields of the exciter coils below the pole shoes in the area intended to be used for plasma ignition. Further permanent magnets are provided in the form of a multi-pole magnet arrangement on both sides and extending linearly with respect to the magnetic pole shoes. The magnetic fields of the multi-pole arrangement are superimposed on the inductively coupled plasma in this layout. The layout that is described is especially suitable for elongated, flat plasma sources, as used as a preference for solar-cell production with a continuous processing method.

EP 0 908-923 B1 describes a plasma source in which the magnetic core (ferrite core), which serves to concentrate the magnetic field in the plasma chamber, is also simultaneously used as a closure for the connector opening of the plasma source to the processing chamber. Preferred embodiments of the plasma source are rotationally symmetric. No multi-pole magnet arrangements are used to generate Whistler waves in the plasma.

Known designs of ICP sources do not have the advantageous characteristics of CCP sources.

The problem therefore arises of creating a plasma source that unites the advantages of the ICP and CCP plasmas.

SUMMARY

The subject matter of the instant invention is a plasma generation device in which at least one inductive device and at least one capacitive device are provided for coupling energy into a plasma in a plasma chamber. The at least one inductive device and the at least one capacitive device can be supplied with energy separately from one another by different frequency generators or by a common frequency generator.

DETAILED DESCRIPTION

The problem is solved as per the invention with a device according to claim 1. Advantageous embodiments are presented in the dependent sub-claims.

The device as per the invention distinguishes itself by the fact that energy is simultaneously coupled into the plasma in an inductive and capacitive fashion.

The invention envisages that the device will have at least one coil for inductive coupling of energy into the plasma. The plasma is generated in the process in the area intended for this, the plasma chamber. The coil is preferably arranged in a groove of the magnetic pole shoe; the opening of the groove (grooved side) is turned towards the plasma (plasma chamber). The coils are preferably embedded in an insulation element (ceramic) here. The arrangement of pole shoes and coils is located in an electrically conducting enclosure that fully surrounds it with the exception of the grooved side of the pole shoes and the coil connections. The grooved side is covered by an electrically conducting Faraday shield. It closes up the interior of the enclosure with respect to the plasma chamber and is connected to the conducting enclosure in a conductive way; the magnetic fields of the coils for the inductive coupling can extend outwards, but electrical fields are reliably shielded or, more specifically, the penetration of electrical fields through the Faraday system is reduced to a very great extent. An additional insulation plate made of a material that is permeable to magnetic fields, which can also serve as an encapsulation or protection for the pole shoe arrangement, can also be inserted between the Faraday shield and the magnetic pole shoe arrangement. This encapsulation can also have a vacuum-tight design with respect to the conducting enclosure to be able to prevent possible contamination of the processing chamber or, as the case may be, to also keep reactive gases or gas fragments in the processing chamber away from the pole shoe arrangement. The interior of the enclosure can form a separately pumped vacuum chamber here or can be connected to the atmosphere or a protective gas device. A counter-electrode that is used with the Faraday shield to form a capacitor arrangement exists as a counterpart to the Faraday shield. The counter-electrode is preferably arranged on the side opposite the Faraday shield and, as a further preference, behind the substrate to be processed. A conductive wall in the form of a so-called dark space shield is arranged outside of the enclosure so as to be electrically insulated from it and surrounds the enclosure with the exception of the grooved side and through-holes for connections. The dark space shield is preferably put at the ground potential of the arrangement. As a further preference, the grooved side of the dark space shield is provided with a cover made of a non-conducting material (dielectric cover). The purpose of the dark space shield is to limit the creation of plasma to the plasma chamber. The at least one coil is connected to a frequency generator, preferably a high frequency generator, to feed energy into the plasma. A further frequency generator is connected to the enclosure and Faraday shield connected to it. The two other poles of the frequency generators are preferably at ground potential.

As a preference, multi-pole magnet arrangements in parallel with the coil or coils are arranged in such a way that the magnetic field of the multi-pole magnet arrangements is superimposed on that of the coils in the plasma. The multi-pole magnet arrangements are preferably aligned in such a way that they contribute to the generation of so-called Whistler waves. The Whistler waves run in a plasma edge layer along the surface of the plasma and improve the energy input into it. The multi-pole magnet arrangements are preferably aligned to attract one another to achieve this. Together with the magnetic field of the coils, they form a type of magnetic bottle that advantageously encloses and shapes the plasma. The multi-pole magnet arrangements are preferably arranged outside of the dark space shield. In the process, they are preferably arranged next to the dark space shield, in the direction of the plasma chamber, at the height of the dielectric cover and terminating with it or, in a further preferred embodiment, next to the plasma chamber.

In summary, an arrangement according to DE 103 58 505 B4 consequently, as per the invention, has an enclosure with a Faraday shield in the direction of the plasma chamber and, moreover, is provided with a dark space shield. In addition to the inductive energy coupling of the device part according to DE 103 58 505 B4, there is a capacitive energy coupling into the plasma through the enclosure, more specifically the Faraday shield, that is additionally provided and that surrounds the device according to DE 103 58 505 B4.

The enclosure is preferably cooled. This is done by passing a cooling agent through it, for instance. Other components can also be provided if necessary with coolant lines or other convective or conductive types of heat removal.

The ICP coils for inductive energy coupling into the plasma are preferably provided in pairs, extending linearly and running in parallel. The energy coupling then takes place at the opposite ends of the coils of the pair for reasons relating to symmetry. Several coil pairs are advantageously arranged in parallel to one another in a plasma generation device. Other coil configurations are also possible, however, for instance circular or undulatory arrangements. In the case of constructions that are especially elongated, individual ICP coils can be provided with additional energy supplies. A nested arrangement of coils is also possible.

The Faraday shield is comprised of a conductive, preferably metallic material. It has openings for the magnetic field lines of the ICP coils to be extended out of the enclosure. The openings run in parallel to the magnetic field lines as a preference, in order to have the least possible influence on them. The openings are therefore designed as slots as a preference. A preferred embodiment envisages a rectangular metal sheet as a Faraday shield in which slots alternately extend into it, almost to the opposite side, from the long sides of the metal sheet. A meandering structure arises in this way that makes a contribution towards reducing or suppressing the creation of eddy currents in the Faraday shield. Other embodiments of the Faraday shield are possible and realizable for a person skilled in the art; it is important that the openings for the extension of the magnetic field lines preferably run in parallel with them.

The dark space shield is conductive and prevents the ignition of a proprietary plasma outside of the area intended for that via the capacitive supply of energy through the enclosure. The dark space shield is preferably put at ground potential for that.

The dielectric cover made of, for instance, quartz material or an aluminum-oxide ceramic, is preferably located between the Faraday shield and the plasma and oriented towards the plasma chamber, as a termination of the dark space shield and as protection against contamination.

The plasma that arises is potential free to a very great extent with respect to all of the walls of the plasma processing chamber.

The density of the plasma is predominantly determined by the inductive energy coupling in the device as per the invention. Its movement (acceleration movement of the ions) is, however, defined by the capacitive coupling to a great extent. The excitation frequencies and energy contributions of the ICP and CCP energy supply into the plasma can be advantageously specified or changed separately from one another. Furthermore, phase-synchronized excitation is also possible. Suitable state-of-the-art HF or LF generators (high frequency or low frequency generators) can be used for the supply of energy. The frequencies of the inductive coupling are preferably in the range of 100 kHz to 13.56 MHz and can also be provided in a pulsed form in the process. The capacitive coupling permits excitation frequencies in the range of direct current (0 Hz) to multiple MHz, preferably from 40 kHz to 400 kHz. These frequencies can also be provided in a pulsed or continuous fashion here.

Gas is preferably supplied to the plasma generation device separately from this on the side, next to the plasma chamber. A gas exhaust system can also be provided as an option.

The dimensions of the device as per the invention and therefore the plasma that is generated as well can be scaled without further ado.

The device as per the invention makes a linear scaling of the performance of the plasma source possible up to the high-rate range without standing-wave problems arising. A very high frequency technique is not required to reach very high plasma densities, as is the case in the prior art with VHF for parallel-plate arrangements.

The device as per the invention is preferably used in a pressure range from $5*10^{-4}$ mbar to 0.1 mbar.

The plasma generation device as per the invention can be advantageously applied in the production of solar cells. The flat, elongated substrate or the layers arranged on top of it are frequently subjected to a plasma treatment here. In the process, they are either moved through a treatment chamber or arranged in one. It is especially advantageous when the plasma generation device provides uniform plasma over the entire width of the substrate, which may be moved if necessary. It is therefore advantageous to adapt the dimensions of the coils to the dimensions of the substrate to be treated and to design the coils to be at least as long as the substrate moved under them is wide. It is advantageous when the length of the coils somewhat exceed the width of the substrate to suppress edge effects.

A further application area is the coating of other, preferably flat, elements, for instance of foils.

Because of the positive characteristic that the inductive energy supply can also penetrate walls of processing chambers in addition to the Faraday shield and the dark space cover, the device can be arranged inside a processing chamber; the multi-pole magnet arrangements can be arranged inside of or outside of the processing chamber, or the device is arranged inside of the processing chamber, wherein the multi-pole magnet arrangements are next to the dark space cover or next to the plasma chamber.

The existing capacitive coupling can also be used as an ignition aid for the inductively coupled plasma because of the encasement of the ICP arrangement with conducting walls (enclosure and Faraday shield). An increased HF voltage is applied to the capacitively coupled arrangement for this in a preferred embodiment in addition to the HF power supply of the ICP arrangement for a short period of time that is preferably in the range of a few milliseconds to a few 100 ms, with a special preference for the range of 2 ms to 800 ms. After the ignition of the inductively coupled plasma, the HF power supply of the capacitively coupled plasma can be operated further at ground potential or as intended with a defined HF output.

The device as per the invention can also be operated as an independent plasma source with pure inductive coupling, and thus without the capacitive coupling. The HF voltage that is required for a short time for the ignition can them, as an example, also be advantageously derived from the HF power supply for the inductive coupling for reliable plasma ignition of the inductive plasma. That takes place with an HF switch as a preference.

This approach is used as a preference in an application that has already been optimized to save an otherwise separate HF power supply for the capacitive coupling arrangement. The HF power requirements needed for the capacitively coupled plasma will also be supplied in an advantageous way via fixed or adjustable HF power dividers from the HF power supply of the inductively coupled plasma.

DETAILED DESCRIPTION OF THE PREFERRED EMBODIMENT

The invention will be explained with the aid of various illustrations below without being limited to these examples.

Figure 1A:
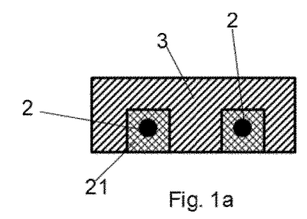

FIG. 1a to FIG. 1e show arrangement variants of the ICP coils (2) in the magnetic pole shoe arrangements (3). The coils (2) run in a linear fashion, perpendicular to the plane of the drawing. They are embedded in ceramic insulation elements (21). Two coils (2) with their own ceramic insulation elements (21) are shown in FIG. 1a. The coils (2) are connected at opposite ends, i.e. the first coil (2) is actuated with high frequency below the plane of the drawing, whereas this takes place above the plane of the drawing for the second one, or the other way around.

Figure 1B:
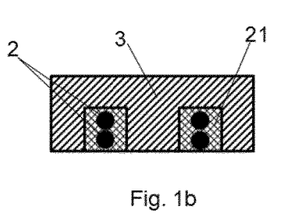
Figure 1C:
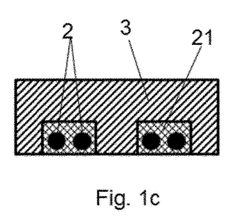

The coils (2) are arranged in pairs in the ceramic insulation elements (21) in FIGS. 1b and 1c. The connections are also designed to be opposite for each coil pair here.

Figure 1D:
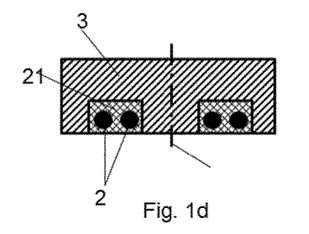
Figure 1E:
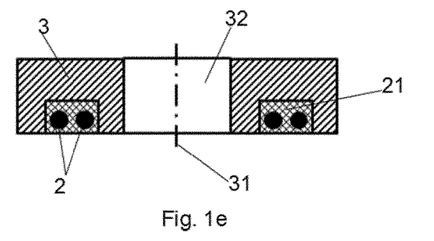

Rotationally symmetric designs of coil arrangements are shown in FIG. 1d and FIG. 1e. The coil axes run in concentric, circular paths in the process.

Figure 2A:
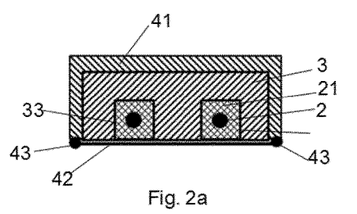
Figure 2B:
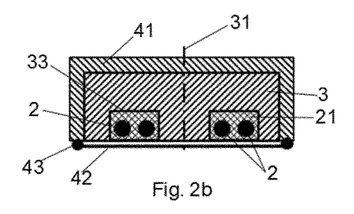
Figure 2C:
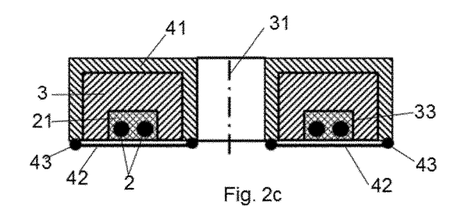

FIG. 2a to FIG. 2c show the arrangements from FIG. 1a, FIG. 1d and FIG. 1e with the conducting enclosure that is comprised of the enclosure (41) in the area of the magnetic pole shoe arrangement (3) and the Faraday shield (42) in the grooved area of the pole shoe arrangement. There is a conducting contact (43) (shown schematically here) between the enclosure (41) and the Faraday shield (42). The grooves (33) are separately marked once again here. The grooved area is consequently the side of the pole shoe arrangement (3) on which the grooves (33) for insertion of the ceramic insulation elements (21) with the coils (2) are located. Analog design forms are also possible for the round embodiments (recognizable via the axes (31) in FIG. 2b and FIG. 2c).

Figure 3A:
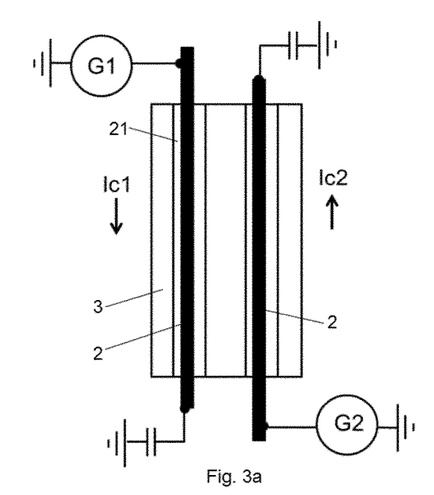
Figure 3B:
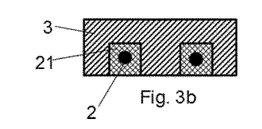

FIG. 3a and FIG. 3b schematically show a circuit variant of the ICP coils according to the prior art. FIG. 3a shows that the two coils (2) are supply with high frequency by the two generators G1 and G2. The feed-in is at opposite ends, so the currents Ic1 and Ic2 run in opposite directions.

A sectional view is schematically shown in FIG. 3b.

Figure 4A:
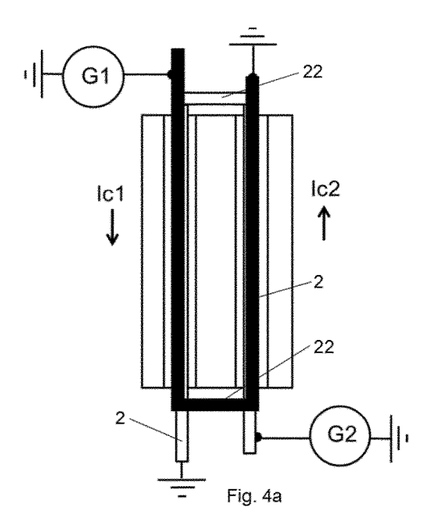
Figure 4B:
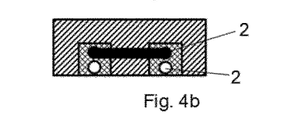

FIG. 4a and FIG. 4b show a further circuit variant of the ICP coils according to the prior art. The coils (2) are arranged in the grooves of the pole shoes, similar to the manner shown in FIG. 1b. Since the coils are designed to be U-shaped and arranged on top of one another, however, a connection line (22) results between the legs of the "U" in each case on the face of the pole shoes. The currents (Ic1 and Ic2) are opposite one another in the two legs due to the U shape. This applies to the two coils that are arranged on top of one another. Whether or not the fields oscillate in common mode or in push-pull mode between the two coils (2) is now dependent upon the phase relationship of the two generators G1 and G2. Any desired phase shifts are also possible. The generators (G1, G2) are preferably connected in such a way that the flow is in the same direction through the legs of different coils (2) that are on top of one another.

Figure 5:
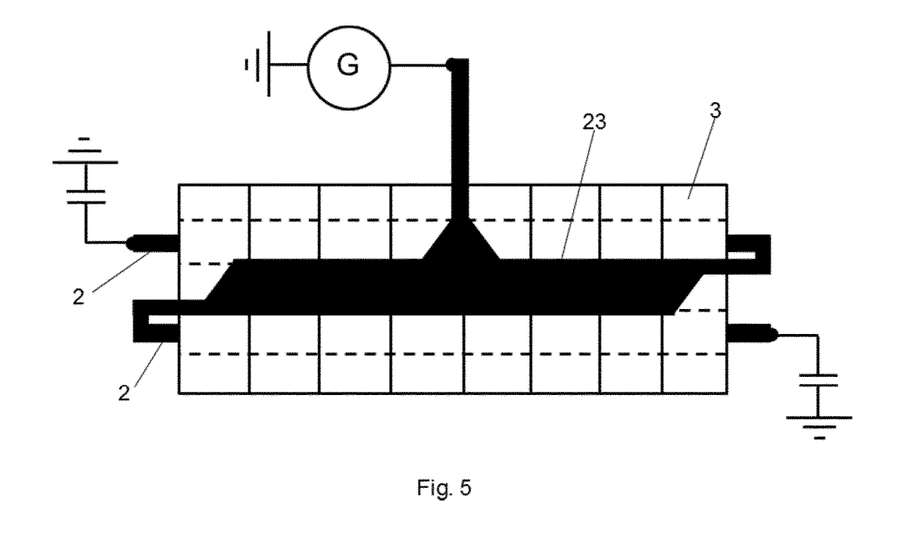

FIG. 5 schematically shows how two coils (2) are supplied with high frequency at opposite ends by the generator (G) via a current distribution bridge (23) (T distributor); the high-frequency supply is connected in the middle of the distribution bridge (23) to prevent asymmetrical current flows.

Figure 6A:
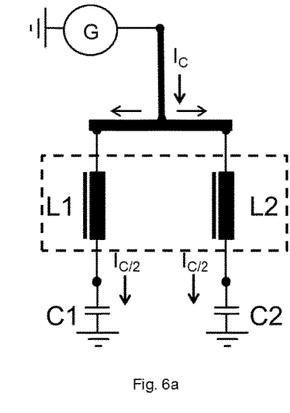
Figure 6B:
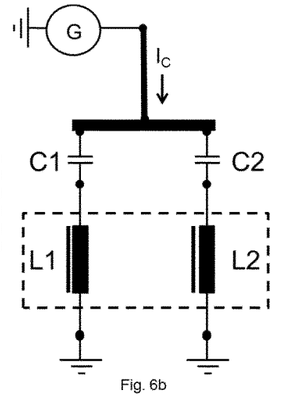
Figure 6C:
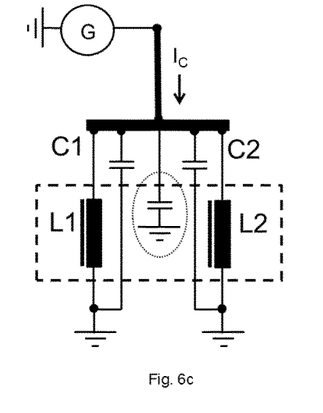

FIG. 6a to FIG. 6c show circuit variants of the coils (L1, L2). It is the case in all three circuit variants that the coils and the capacitors are equal in each case, i.e. L1=L1 and C1=C2. Symmetrical oscillator circuits arise in that way.

Figure 7A:
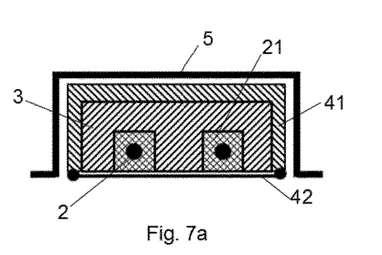
Figure 7B:
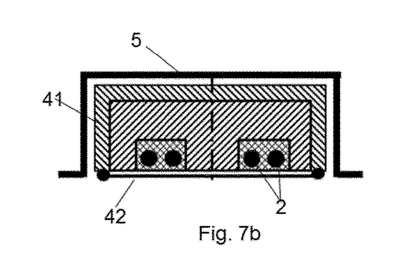
Figure 7C:
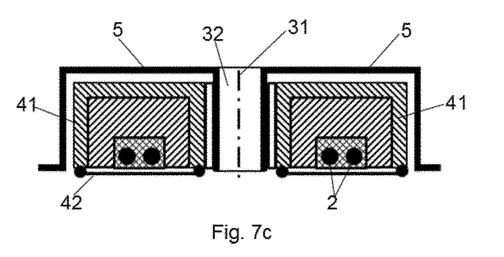

FIG. 7a to FIG. 7c schematically show parts of the design as per the invention in a sectional view. Although FIGS. 7a and 7b are linearly elongated, the arrangement according to FIG. 7c is rotationally symmetric. A dark space shield (5) is arranged in each case around the design known from FIGS. 2a to 2c.

Figure 8:
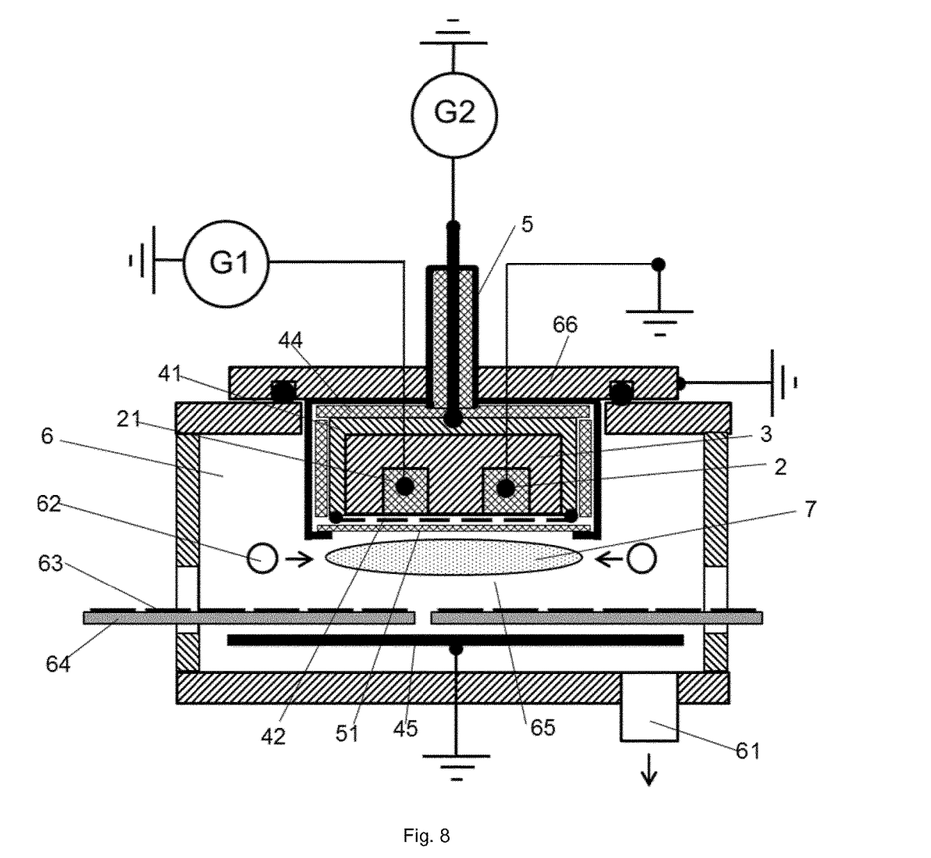

FIG. 8 schematically shows the device as per the invention in its entirety (with the exception of the multi-pole arrangements) in a processing chamber (6). The device for the inductive energy supply into the plasma (7) is essentially comprised of two straight conductors (also see FIG. 3a) that are to still be designated as coils (2) for the sake of simplicity. The HF energy of the generator G1 is supplied, analogously to the depiction in FIG. 5 or FIGS. 6a, 6b and 6c, via a T distributor (23) that is not shown. The coils (2) are embedded in ceramic insulation elements (21) and are then, in the elements, embedded in the grooves of the pole shoes (3). The enclosure (41), which is terminated in the direction of the direction of the plasma chamber with the plasma (7) by the Faraday shield (42), surrounds the pole shoes (3). The Faraday shield (42) and the enclosure (41) are connected in an electrically conducting fashion. An insulation layer (44) (electrically insulating), which for its part is encased by the dark space shield (5) with the exception of the grooved side, is formed around the enclosure (41). As examples, plates made of quartz glass, aluminum-oxide ceramics or other insulation materials or potting compounds that also cause the least possible consumption for their part of the HF power used from the generator G2, in addition to having electrical insulation characteristics, are possibilities for the insulation layer. It is in fact customary to fill out the intermediate space between the enclosure (41) and the dark space shield (5) with an insulation layer (44) made of insulating materials, but operation can also take place without this insulation layer. The distance between the enclosure (41) and the dark space shield has to be designed according to the well-known Paschen's law for this to prevent plasma ignition in the intermediate space. The grooved side of the dark space shield (5) also has a quartz disk (51) here as contamination protection.

The plasma chamber (65), through which the substrate disks (63) are moved as the material to be processed, is located in front of the quartz disk. They are on the substrate carriers (64) here. The plasma (7) is supplied from the gas inlets (62) on both sides of the plasma chamber (65).

The device has two HF generators (G1, G2). The generator (G1) feeds its high frequency directly into the respective side of the coils (2) via a T distributor (23) (not shown). The sides of the coils (2) opposite the supply are directly connected to ground or are alternatively set to ground via an additional capacitor. Also see FIGS. 6a and 6b. with regard to this. The second generator (G2) is connected to the enclosure (41) and, via that, to the Faraday shield (42) in a conductive way. The counter-electrode (45) is arranged below the substrate (63) that is moved. It forms, together with the enclosure (41) and the Faraday shield (42), a capacitor arrangement. This is also called a parallel-plate arrangement by persons skilled in the art. The counter-electrode (45) is put at ground potential in this embodiment. In a few applications, the counter-electrode can also be connected to an additional generator so that a mixed-frequency mode can be used with the capacitively coupled plasma generation that is fed in by the generator (G2). Generators can be used for the mixed-frequency mode that can either deliver DC voltages or pulsed DC voltages or frequencies in the range of a few Hz to around 27 MHz. The movement of the ions in the plasma (7) can be influenced in the desired way by means of the mixed-frequency mode so that improved processing of the substrates (63) is possible. The processing chamber (6) is at ground potential. It is thereby possible for the capacitively coupled plasma excitation by the generator (G2) to also be effected without a counter-electrode (45). The processing chamber (6) itself then acts like a counter-electrode with respect to the Faraday shield (42). In an analogous fashion to the mixed-frequency mode at the counter-electrode (45), an additional generator can also be connected to the feed-in of the generator (G2) on the device (1) as per the invention to make a mixed-frequency mode possible. A vacuum is created in the processing chamber (6) with a vacuum pump (not shown) via an appropriate connector (61). The device as per the invention is fastened by means of a flange (66) in a feed-through of the wall of the processing chamber (6).

Figure 9A:
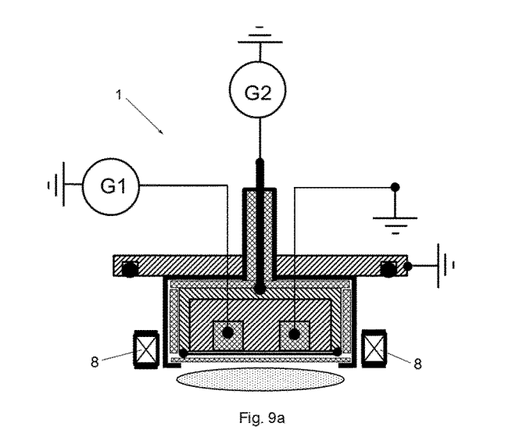
Figure 9B:
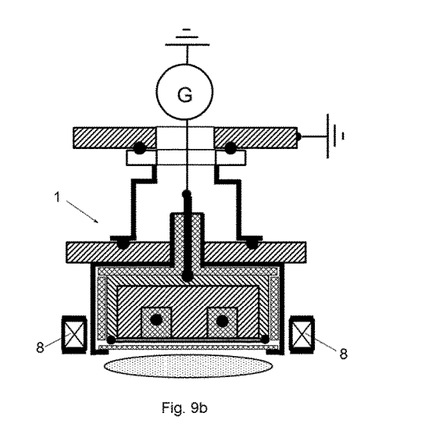

FIG. 9a and FIG. 9b schematically show two assembly variants of the device as per the invention. The device has two multi-pole arrangements (8) here that run in parallel with the coils and that are adjacent to the device as per the invention.

FIG. 9b shows, in particular, an installation variant in connection with this. The device as per the invention is guided via a vacuum-tight intermediate piece to the processing area of the substrates and encloses all of the required supply inputs for process utilities. The required supply inputs of process utilities and, in particular, the electrical power supply can be laid under atmospheric conditions because of that. Depending on the design of the intermediate piece or, as the case may be, of several intermediate pieces, the device as per the invention can therefore be adapted to the conditions in the process chamber in a very flexible way. These intermediate pieces can be assemblies that are fixed in place or, for instance, also flexible hoses that are suitable for a vacuum. When flexible intermediate pieces are used, the device (1) as per the invention can also be moved in a defined way with respect to the substrates with the aid of appropriate drive systems.

Figure 10A:
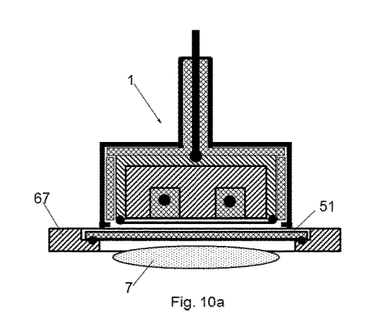
Figure 10B:
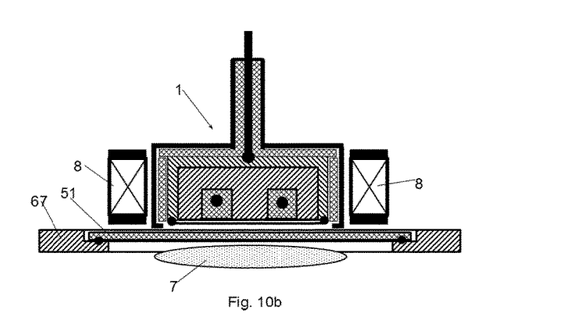

FIG. 10a and FIG. 10b schematically show how the device (1) as per the invention can be arranged outside of the processing chamber (6) on its wall (67). A corresponding opening is provided in the metallic wall that is closed up by the quartz disk (51) on the grooved side of the dark space shield.

Two magnetic multi-pole arrangements (8) are additionally provided in FIG. 10b that are likewise located outside of the processing chamber (6) and that run in parallel to the coils. The magnetic fields of the multi-pole arrangements (8) also enter the processing chamber through the dielectric quartz disk (51) and act on the plasma (7).

Figure 11A:
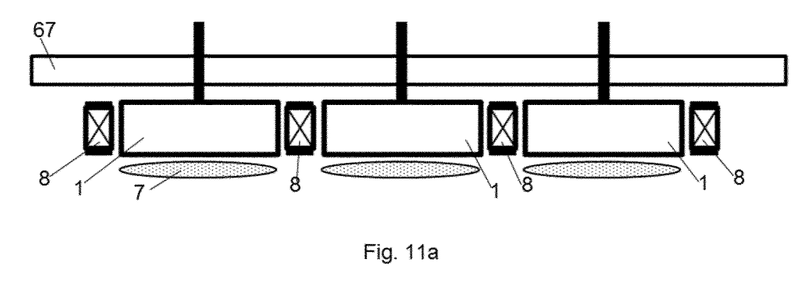
Figure 11B:
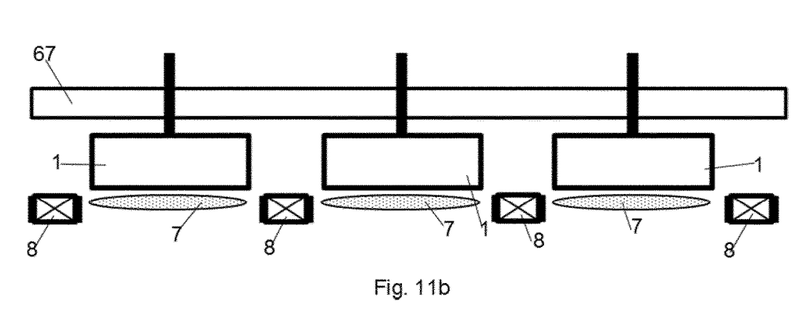

FIG. 11a and FIG. 11b schematically show arrangement variants of the magnetic multi-pole arrangements (8). The device (1) as per the invention (shown without the counter-electrode) is located behind the wall (67) of the processing chamber in its interior. The magnetic multi-pole arrangements are arranged next to the device (1) as per the invention in FIG. 11a and act on the plasma (7) from there. The magnetic multi-pole arrangements are arranged next to the plasma in FIG. 11b. They are therefore more or less in the plasma chamber. The field effect on the plasma (7) is stronger due to the smaller spacing, but the contamination or wear is also stronger.

It is advantageous that only one magnetic multi-pole arrangement that acts on both sides is required between two neighboring devices as per the invention.

Figure 12:
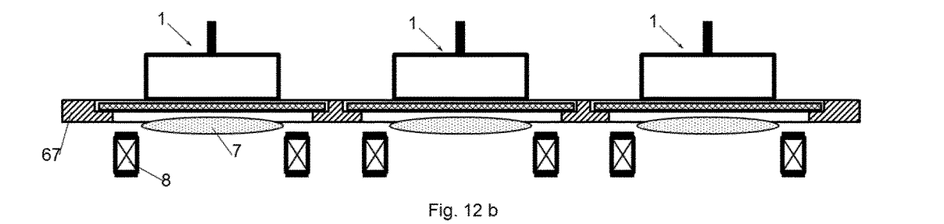
Figure 12A:
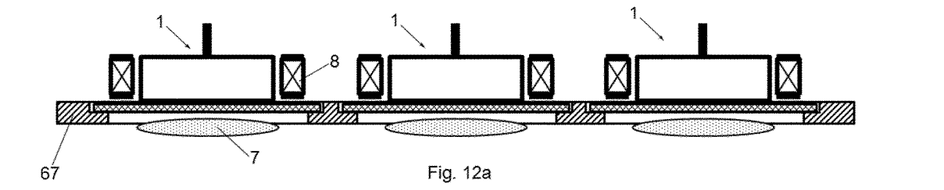
Figure 12C:
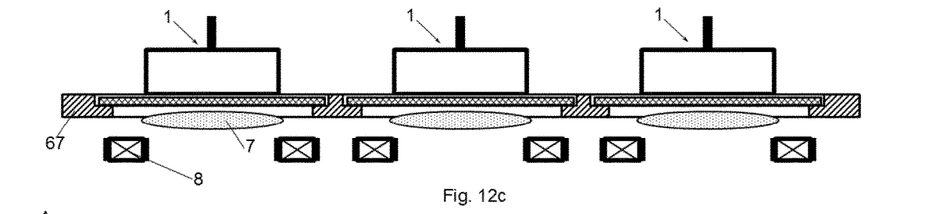

FIG. 12a to FIG. 12c schematically show arrangement variants of the magnetic multi-pole arrangements in their relationship to the device (1) as per the invention. Whereas both the device as per the invention and the multi-pole arrangement are located outside of the processing chamber in FIG. 12a, and their fields merely extend through the dielectric cover into the interior of the processing chamber, the device as per the invention is located outside of the processing chamber and the multi-pole arrangement is located inside of the processing chamber in FIG. 12b and FIG. 12c. FIG. 12b and FIG. 12c predominantly differ in the alignment of the magnetic pole shoes in the multi-pole arrangements. The magnetic pole shoes have a perpendicular orientation to the wall (67) in FIG. 12b and a parallel orientation in FIG. 12c. The orientation of the magnetic pole shoes influences the superposition and form of the magnetic field of the multi-pole arrangement with reference to the ICP plasma that is formed. In special cases, a different angular positioning of the magnetic pole shoes between perpendicular or parallel to the wall (67) can also be more advantageous.

Figure 13A:
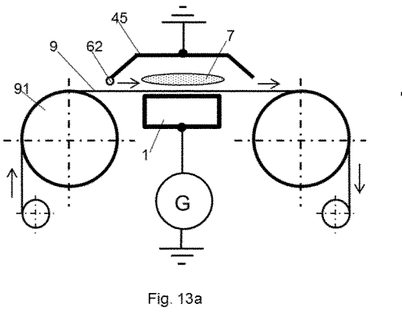
Figure 13B:
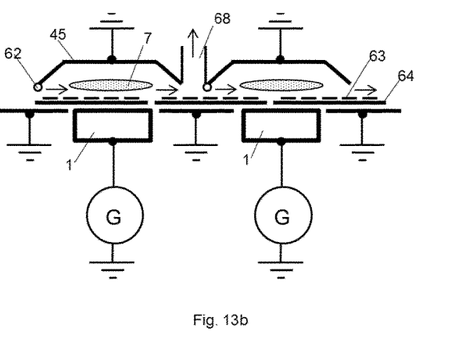

FIG. 13a and FIG. 13b schematically shown application variants of the device (1) as per the invention. The device (1) is used to coat foils in FIG. 13a. Only the generator (G) for the capacitive energy coupling is shown for simplification. The plasma is generated on the side of the foil (9) turned away from the device. The process gas is blown in from the gas inlet line (62) between the foil (9) and the counter-electrode (45) and converted into plasma (7). Foil is continually, additionally fed in for processing via the guide roller (91); the foil is transported further via an equivalent guide roller after processing to be wound up. It is advantageous in FIG. 13a and FIG. 13b that the foil or carrier more or less permanently cover the devices. The device is very maintenance-friendly because of that in the case of plasma coating.

Two plasma sources are arranged next to one another in FIG. 13b. Residual gas is discharged via the gas outlet (68) between the two counter-electrodes (45). The substrates (63) are moved on the substrate carriers (64) one after the other into the two processing rooms that are connected one behind the other (indicated here by the curvature of the counter-electrodes (45)) and subjected to the processing.

Figure 14:
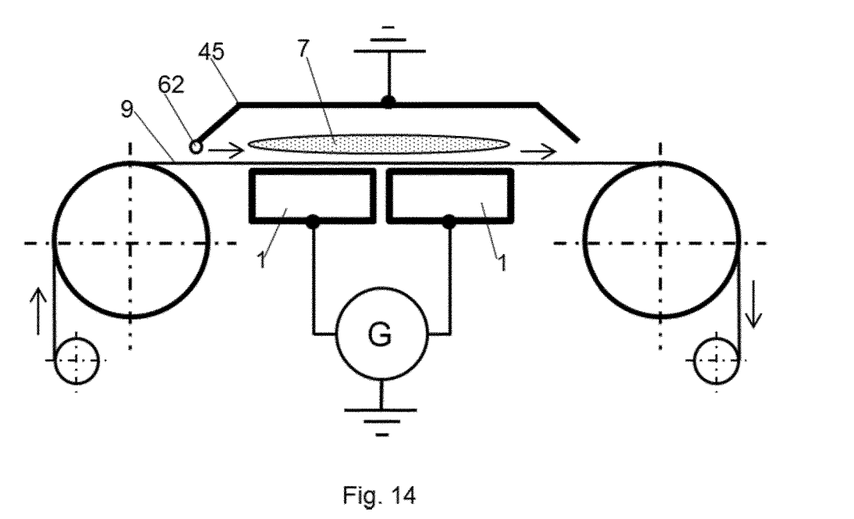

FIG. 14 schematically shows a further variant for using the device as per the invention. The two plasma sources (1) can, as an example, also be supplied with energy for the capacitive coupling from a symmetrical generator G (the inductive coupling with a generator etc. exists, but was not shown). In another variant, the two plasma sources (1) are also operated with bipolar or unipolar, pulsed DC voltages. A simultaneous supply of power from several plasma sources (1) with only one generator system is also a customary approach to reduce the number of costly generators and matching networks.

The two devices (1) generate a common plasma (7) with which the foil (9) is processed.

Figure 15:
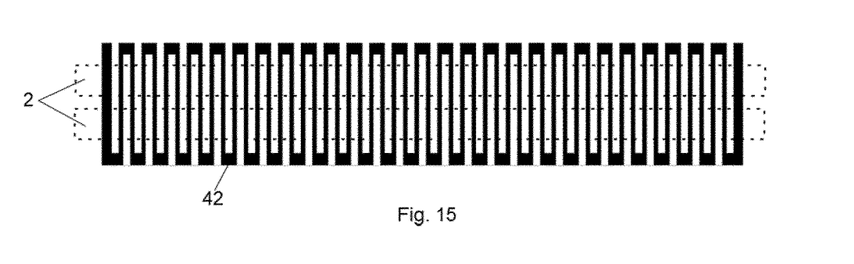

FIG. 15 schematically shows a Faraday shield (42) that is used to terminate the conducting enclosure on the grooved side in the direction of the plasma chamber. The meandering structure has slots that run in parallel with the field lines of the ICP coils (2) (schematically shown with dashed lines). The creation of eddy currents in the Faraday shield (42) is advantageously reduced because of the meandering structure.

DESIGN EXAMPLE

An embodiment of the plasma device as per the invention is shown in a detailed fashion with the presentation of FIG. 8 without the intention of limiting the invention to this embodiment.

The device as per the invention is arranged in a processing chamber (6) according to the prior art, as is customary used for a continuous process in solar-cell engineering. The device for an inductive supply of energy into the plasma (7) has two coils that are designed to be individual, straight conductors. Also see FIG. 3. The coils have a length of approx. 100 cm with a spacing with respect to one another of approx. 35 mm. The coils are comprised of copper pipes with a pipe diameter of 8 mm. The HF energy of the generator G1 is supplied in a manner analogous to that of FIG. 5. The generator G1 involves an HF generator that is normally connected to the device as per the invention via a matching network (not shown). The generator G1 provides a high frequency of 4 MHz. The HF generator G1 has HF power of approx. 5 kW due to the dimensions of the device (1) that were chosen. The coils (2) are embedded in ceramic insulation elements (21). The dimensions of these insulation elements are adapted to the groove geometry of the pole shoes that are used and are, in terms of the cross section, approximately: 13 mm×32 mm. The insulation elements are then embedded for their part in the grooves of the pole shoes (3). Commercially available E70 cores are used as pole shoes (3). The pole shoes are comprised of the ferrite material 4F1 (of the company Ferroxcube). The pole shoes have a width=71 mm, a height=33 mm and a length=32 mm. 30 individual pole shoes are arranged one behind the other, which results in a joint overall length of approx. 960 mm. The enclosure (41), which is terminated in the direction of the direction of the plasma chamber with the plasma (7) by the Faraday shield (42), surrounds the pole shoes (3). The enclosure is comprised of a milled part made of an aluminum alloy that has a run-around wall thickness of approx. 15 mm. The enclosure is water-cooled to draw away the electrical power dissipation of the pole shoes. A thermally conducting potting compound, foil or glue is used to lead off heat between the pole shoes and the enclosure. The Faraday shield (42) and the enclosure (41) are connected in an electrically conducting fashion. The Faraday shield (42) is comprised, for example, of a non-magnetizable stainless steel sheet and closes up the entire opening area of the enclosure. The material has a thickness of approx. 0.5 mm. The Faraday shield has reciprocal slots with a width of 0.1 to 0.5 mm and a spacing of approx. 10 mm on the long sides. An insulation layer (44) (electrically insulating), which for its part is encased by the dark space shield (5) with the exception of the grooved side, is formed around the enclosure (41). The insulation layer is preferably comprised of two layers of plates made of aluminum oxide ceramic that are nested in one another so that a gap all the way through between the enclosure (41) and the dark space shield (5) is not possible. The total thickness of the layer arrangement is approx. 8 to 12 mm. The grooved side of the dark space shield (5) also has a quartz disk (51) here with a thickness of approx. 4 mm as contamination protection.

The plasma chamber (65), through which the substrate disks (63) are moved as the material to be processed, is located in front of the quartz disk. They are on the substrate carriers (64) here. The plasma (7) is supplied from the gas inlets (62) on both sides of the plasma chamber (65) with process gases.

The device has two HF generators (G1, G2). The generator (G1) of the type Cesar (of the company AE) directly feeds its high frequency of e.g. 4 MHz into the coils (2) via an appropriate inlet (not shown). The second generator (G2) (model Cesar, company AE) is connected to the enclosure (41) and, via that, to the Faraday shield (42) in a conductive way. The high frequency that is fed in is 13.56 MHz here. The counter-electrode (45) for capacitive coupling of the ground is arranged below the substrates (63) that are moved. A radiant heater (not shown!) whose radiation surface is once again made of a stainless steel sheet that is at ground potential is used as a counter-electrode (45). The width of the radiation surface approximately follows the geometry of the lay of the substrate carriers (64), and the radiation surface approximately extends in terms of length between the transport openings of the processing chamber (6). The substrate carrier (64) has the dimensions 1110 mm×756 mm. The counter-electrode (45) forms, together with the enclosure (41) and the Faraday shield (42), a capacitor arrangement. The level of power of the generator G2 that is applied essentially influences the energy conditions of the ions from the plasma (7) incident upon the substrate. The number of ions incident per surface are is predominantly determined by the HF power of the generator G1 that is used. Very flexible adjustment of the processing conditions or, more specifically, the quality of processing of the substrates (63) is therefore possible.

A vacuum of approx. $1 \times 10^{-6}$ mbar is generated in the processing chamber (6) via a vacuum pump system (not shown) via an appropriate connector (61). A typical working pressure in the processing chamber (6) of approx. $5 \times 10^{-4}$ mbar to approx. 0.1 mbar can be set with the intake of process gases. The device as per the invention is fastened by means of a flange (66) in a feed-through of the wall of the processing chamber (6).

LIST OF REFERENCE NUMERALS

1 Device as per the invention
2 ICP coil
21 Ceramic insulation element
22 Connection of the two legs of a U-shaped coil
23 Current distribution bridge for a symmetrical current supply to two coils
3 Magnetic pole shoe arrangement
31 Axis of symmetry of the rotationally symmetric, magnetic pole shoe arrangement
32 Rotationally symmetric hollow area in the pole shoe arrangement 41 Conducting enclosure in the area of the pole shoe arrangement
42 Faraday shield
43 Conductive connection between the Faraday shield and conducting enclosure
44 Non-conductive insulation layer around the conducting enclosure
45 Counter-electrode for capacitive coupling
5 Dark space shield
51 Quartz disk on the grooved side of the dark space shield
6 Processing chamber
61 Vacuum exhaust system
62 Gas inlet for plasma generation
63 Substrate to be processed
64 Substrate carrier for transport through the processing chamber
65 Plasma chamber
66 Flange for fastening the device into the wall of the processing chamber
67 Wall of the processing chamber
68 Gas exhaust system
7 Plasma
8 Magnetic multi-pole arrangements
9 Foil
91 Guide roller for foil
C1 Capacitor of a first oscillation circuit
C2 Capacitor of a second oscillation circuit
G, G1 High frequency generator
G2 High frequency generator
Ic1 Current direction in the coil 1
Ic2 Current direction in the coil 2
L1 Coil of a first oscillation circuit
L2 Coil of a second oscillation circuit

The invention claimed is:

1. Device for plasma generation having at least one inductive device and at least one capacitive device for coupling energy into a plasma in a plasma chamber, wherein the at least one inductive device and the at least one capacitive device are supplied with energy separately from one another by different frequency generators or by a common frequency generator, characterized in that the inductive device is fully surrounded by a conductive enclosure that is terminated on the plasma side by a Faraday shield, to which said enclosure is connected in a conductive manner, and that the conductive enclosure is connected in a conductive manner to a frequency generator and that the conductive enclosure, Faraday shield and at least one counter-electrode form the capacitive device.

2. Device according to claim 1, characterized in that the inductive device has at least one coil that is connected in a conductive manner to a frequency generator and that the at least one coil is arranged in a groove of a magnetic pole shoe.

3. Device according to claim 2, characterized in that the at least one coil in the groove of the magnetic pole shoe is surrounded by a ceramic insulation element.

4. Device according to claim 1, characterized in that the conductive enclosure is equipped with a conductive dark space shield from which it is electrically insulated on the sides that are not turned towards the plasma.

5. Device according to claim 4, characterized in that the dark space shield on the side turned towards the plasma is closed up with a dielectric cover.

6. Device according to claim 5, characterized in that the counter-electrode of the capacitive device is on the opposite side of the plasma chamber with respect to the dielectric cover.

7. Device according to claim 6, characterized in that two capacitive devices are loaded with energy by the same frequency generator and use a common counter-electrode.

8. Device according to claim 1, characterized in that one or two magnetic multi-pole arrangements are located next to the device for plasma generation or next to the plasma chamber and in parallel with the at least one coil, wherein in the case of two multi-pole arrangements, they are located on opposite sides of the coil.

9. Device according to claim 8, characterized in that the device is arranged on the outside of a processing chamber and is separated from the interior by a dielectric disk, and the magnetic multi-pole arrangements are arranged inside of or outside of the processing chamber.

10. Device according to claim 9, characterized in that the dielectric disk is identical to a dielectric cover closing up a conductive dark space shield on a side turned towards the plasma, said conductive dark space shield surrounding the conductive enclosure, which is electrically insulated from the conductive dark space shield on the sides that are not turned towards the plasma.

11. Device according to claim 8, characterized in that the device is arranged on the inside of the processing chamber.

12. Device according to claim 1, characterized in that said device couples energy into a plasma in both an inductive and a capacitive manner and that the plasma serves to process solar-cell wafers or foil.

13. A method for operating a device for plasma generation having at least one inductive device and at least one capacitive device for coupling energy into a plasma in a plasma chamber, wherein the at least one inductive device and the at least one capacitive device are supplied with energy separately from one another by different frequency generators or by a common frequency generator, wherein the inductive device is fully surrounded by a conductive enclosure that is terminated on the plasma side by a Faraday shield, to which said enclosure is connected in a conductive manner, and that the conductive enclosure is connected in a conductive manner to a frequency generator and that the conductive enclosure, Faraday shield and at least one counter-electrode form the capacitive device, comprising the step of applying an increased HF voltage to the capacitive device for a short, defined period of time in addition to the HF power supply of the inductive device, wherein the capacitive coupling serves in that way as an ignition aid for the inductively coupled plasma.

* * * * *